United States Patent
Jin et al.

(10) Patent No.: US 8,963,821 B2
(45) Date of Patent: Feb. 24, 2015

(54) SCAN DRIVING DEVICE AND REPAIR METHOD THEREOF

(71) Applicant: Samsung Display Co., Ltd., Yongin, Gyeonggi-Do (KR)

(72) Inventors: Guang-Hai Jin, Yongin (KR); Dong-Gyu Kim, Yongin (KR); Kwan-Wook Jung, Yongin (KR); Kyong-Hun Cho, Yongin (KR); Moo-Jin Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 149 days.

(21) Appl. No.: 13/802,347

(22) Filed: Mar. 13, 2013

(65) Prior Publication Data

US 2014/0118236 A1    May 1, 2014

(30) Foreign Application Priority Data

Oct. 25, 2012   (KR) .................. 10-2012-0119215

(51) Int. Cl.
  *G09G 3/36*   (2006.01)
  *G09G 3/20*   (2006.01)
  *G11C 19/00*   (2006.01)

(52) U.S. Cl.
  CPC *G09G 3/20* (2013.01); *G11C 19/00* (2013.01); *G09G 2310/0267* (2013.01); *G09G 2330/08* (2013.01); *G09G 2330/12* (2013.01)
  USPC ............. 345/93; 345/51; 345/204; 345/214

(58) Field of Classification Search
  None
  See application file for complete search history.

(56) References Cited

U.S. PATENT DOCUMENTS

| 2003/0227433 A1* | 12/2003 | Moon ........................ 345/100 |
| 2010/0225621 A1* | 9/2010 | Jung et al. ................. 345/204 |
| 2011/0291712 A1* | 12/2011 | Tobita ........................ 327/144 |

FOREIGN PATENT DOCUMENTS

| KR | 10-0196025 | 2/1999 |
| KR | 10-2006-0092667 | 8/2006 |
| KR | 10-2007-0079615 | 8/2007 |

* cited by examiner

*Primary Examiner* — Muhammad N Edun
(74) *Attorney, Agent, or Firm* — Robert E. Bushnell, Esq.

(57) ABSTRACT

A scan driving device includes: a first node transmitted with a clock signal input to a first clock signal input terminal; a second node transmitted with an input signal according to a clock signal input to a second clock signal input terminal; a first transistor transmitting a power source voltage to an output terminal according to a voltage of the first node; a second transistor formed to transmit the clock signal input to the third clock signal input terminal to the output terminal according to the voltage of the second node; and a dummy transistor formed to transmit the clock signal input to the third clock signal input terminal to the output terminal according to the voltage of the second node. One of the second transistor and the dummy transistor is cut off.

11 Claims, 5 Drawing Sheets

SCAN DRIVING DEVICE AND REPAIR METHOD THEREOF

CLAIM OF PRIORITY

This application makes reference to, incorporates the same herein, and claims all benefits accruing under 35 U.S.C. §119 from an application earlier filed in the Korean Intellectual Property Office on 25 Oct. 2012 and there duly assigned Serial No. 10-2012-0119215.

BACKGROUND OF THE INVENTION

1. Field of the Invention

An embodiment of the present invention relates to a scan driving device and a repair method thereof. More particularly, an embodiment of the present invention relates to a scan driving device improving a process yield and a driving method thereof.

2. Description of the Related Art

A display device sequentially applies a scan signal with a gate-on voltage to a plurality of scan lines and applies a data signal corresponding to the scan signal with the gate-on voltage to a plurality of data lines so as to display an image.

A scan driving device has a structure in which a plurality of scan driving blocks are sequentially disposed in order to sequentially output the scan signal with a gate-on voltage. A next scan driving block receives the scan signal from the previously arranged scan driving block to generate a scan signal so that a plurality of scan driving blocks can sequentially output the scan signal with a gate-on voltage.

If one of a plurality of scan driving blocks is not operated or is deteriorated in the producing process, a line defect is generated, thereby generating a defect of the entire scan driving device. Practically, it is difficult to individually replace the defective scan driving block with a good scan driving block, and the entire scan driving device including the defective scan driving block is destroyed.

The above information disclosed in this Background section is only for enhancement of understanding of the background of the invention and therefore it may contain information that does not form the prior art that is already known in this country to a person of ordinary skill in the art.

SUMMARY OF THE INVENTION

An embodiment of the present invention provides a scan driving device solving a defect of a scan driving block when a defect is generated in a partial scan driving block among a plurality of scan driving blocks, and a repair method thereof.

A scan driving device according to an embodiment of the present invention includes a plurality of scan driving blocks that are sequentially arranged, and the plurality of scan driving blocks respectively include: a first node transmitted with a clock signal input to a first clock signal input terminal; a second node transmitted with an input signal according to a clock signal input to a second clock signal input terminal; a first transistor transmitting a power source voltage to an output terminal according to a voltage of the first node; a second transistor formed to transmit a clock signal input to a third clock signal input terminal to the output terminal according to a voltage of the second node; and a dummy transistor formed to transmit the clock signal input to the third clock signal input terminal to the output terminal according to the voltage of the second node. One of the second transistor and the dummy transistor is cut off.

The dummy transistor may be formed to be cut off in a manufacturing process, and the second transistor may be connected to transmit the clock signal input to the third clock signal input terminal to the output terminal according to the voltage of the second node.

When a defect of the second transistor is generated, the second transistor may be cut off, and the dummy transistor may be connected to transmit the clock signal input to the third clock signal input terminal to the output terminal according to the voltage of the second node.

The plurality of scan driving blocks may further respectively include a first capacitor including one electrode connected to the second node and the other electrode connected to the output terminal.

The plurality of scan driving blocks may further respectively include a second capacitor including one electrode connected to the power source voltage and the other electrode connected to the first node.

The plurality of scan driving blocks may further respectively include a third transistor including the gate electrode connected to the second clock signal input terminal, one electrode applied with the input signal, and the other electrode connected to the second node.

The plurality of scan driving blocks may further respectively include a fourth transistor including the gate electrode connected to the first clock signal input terminal, one electrode connected to the first clock signal input terminal, and the other electrode connected to the first node.

The plurality of scan driving block may further respectively include: a fifth transistor including a gate electrode applied with the input signal and one electrode connected to the first clock signal input terminal; and a sixth transistor including a gate electrode connected to the second clock signal input terminal, one electrode connected to the other electrode of the fifth transistor, and the other electrode connected to the first node.

The plurality of scan driving blocks may further respectively include a seventh transistor including a gate electrode connected to the third clock signal input terminal and one electrode connected to the second node; and an eighth transistor including a gate electrode connected to the first node, one electrode connected to the other electrode of the seventh transistor, and the other electrode connected to the output terminal.

At least one of the first transistor, the second transistor, the third transistor, the fourth transistor, the fifth transistor, the sixth transistor, the seventh transistor, the eighth transistor, and the dummy transistor may be an oxide thin film transistor.

A method of repairing a scan driving device including a plurality of scan driving blocks including a first node transmitted with a clock signal input to a first clock signal input terminal, a second node transmitted with an input signal according to a clock signal input to a second clock signal input terminal, and a first transistor transmitting a power source voltage to an output terminal according to a voltage of the first node according to another embodiment of the present invention includes: forming a second transistor to transmit the clock signal input to a third clock signal input terminal to the output terminal according to a voltage of the second node; forming a cutoff of a dummy transistor transmitting the clock signal input to the third clock signal input terminal to the output terminal according to a voltage of the second node; and cutting off the second transistor and connecting the dummy transistor to transmit the clock signal input to the third clock signal input terminal according to the voltage of the second node when a defect of the second transistor is generated.

A defect of the scan driving device including a plurality of scan driving blocks may be solved, and a yield in the manufacturing process of the scan driving device may be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in the embodiments, like reference numerals designate like elements throughout the specification representatively in a first embodiment, and only elements of embodiments other than those of the first embodiment will be subsequently described.

Descriptions of parts not related to the present invention are omitted, and like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Figure 1:
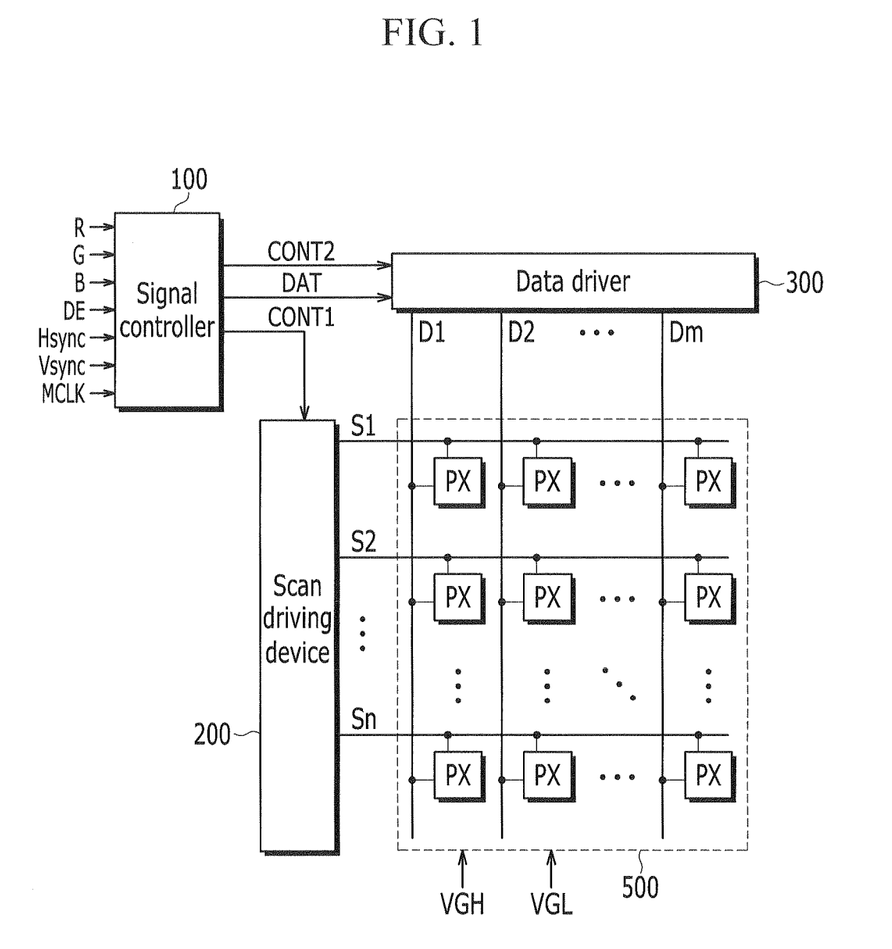
FIG. 1 is a block diagram of a display device according to an embodiment of the present invention.

FIG. 1 is a block diagram of a display device according to an embodiment of the present invention.

In reference to FIG. 1, a display device includes a signal controller 100, a scan driving device 200, a data driver 300, and display unit 500.

The signal controller 100 receives video signals R, G, and B that are inputted from an external device, and a synchronization signal. The video signals R, G, and B include luminance information of each pixel PX, and the luminance has a grayscale having a predetermined number, for example $1024=2^{10}$, $256=2^8$, or $64=2^6$. For example, the input control signals may include a vertical synchronization signal Vsync, a horizontal synchronization signal Hsync, a main clock signal MCLK, and a data enable signal DE.

The signal controller 100 generates a first driving control signal CONT1, a second driving control signal CONT2, and an image data signal DAT according to the video signals R, G, and B, the horizontal synchronization signal Hsync, the vertical synchronization signal Vsync, and the main clock signal MCLK.

The signal controller 100 divides the video signals R, G, and B by a frame unit according to the vertical synchronization signal Vsync, and divides the video signals R, G, and B by a scan line unit according to the horizontal synchronization signal Hsync to generate the image data signal DAT. The signal controller 100 transmits the image data signal DAT along with the first driving control signal CONT2 to the data driver 300.

The display unit 500 includes a plurality of scan lines S1-Sn, a plurality of data lines D1-Dm, and a plurality of pixels PX connected to a plurality of signal lines S1-Sn and D1-Dm and arranged in an approximate matrix. The plurality of scan lines S1-Sn extend in an approximate row direction and almost parallel to each other. The plurality of data lines D1-Dm extend in an approximate column direction and almost parallel to each other. The plurality of pixels PX of the display unit 500 receive the first power source voltage VGH and the second power source voltage VGL from the outside.

The scan driving device 200 is connected to a plurality of scan lines S1-Sn and generates a plurality of scan signals S[1]-S[n] according to the first driving control signal CONT1. The scan driving device 200 sequentially applies the scan signals S[1]-S[n] of a gate-on voltage to a plurality of scan lines S1-Sn.

The first driving control signal CONT1 includes a scan start signal SSP, a clock signal SCLK, etc. The scan start signal SSP is a signal to generate a first scan signal to display the image of one frame. The clock signal SCLK is a synchronization signal to sequentially apply the scan signal to a plurality of scan lines S1-Sn.

The data driver 300 is connected to a plurality of data lines D1-Dm, samples and holds the image data signal DAT according to the second driving control signal CONT2, and applies a plurality of data signals to a plurality of data lines D1-Dm. The data driver 300 applies the data signal having a predetermined voltage range to a plurality of data lines D1-Dm by corresponding to the scan signals S[1]-S[n] of the gate-on voltage to write the data to a plurality of pixels.

Figure 2:
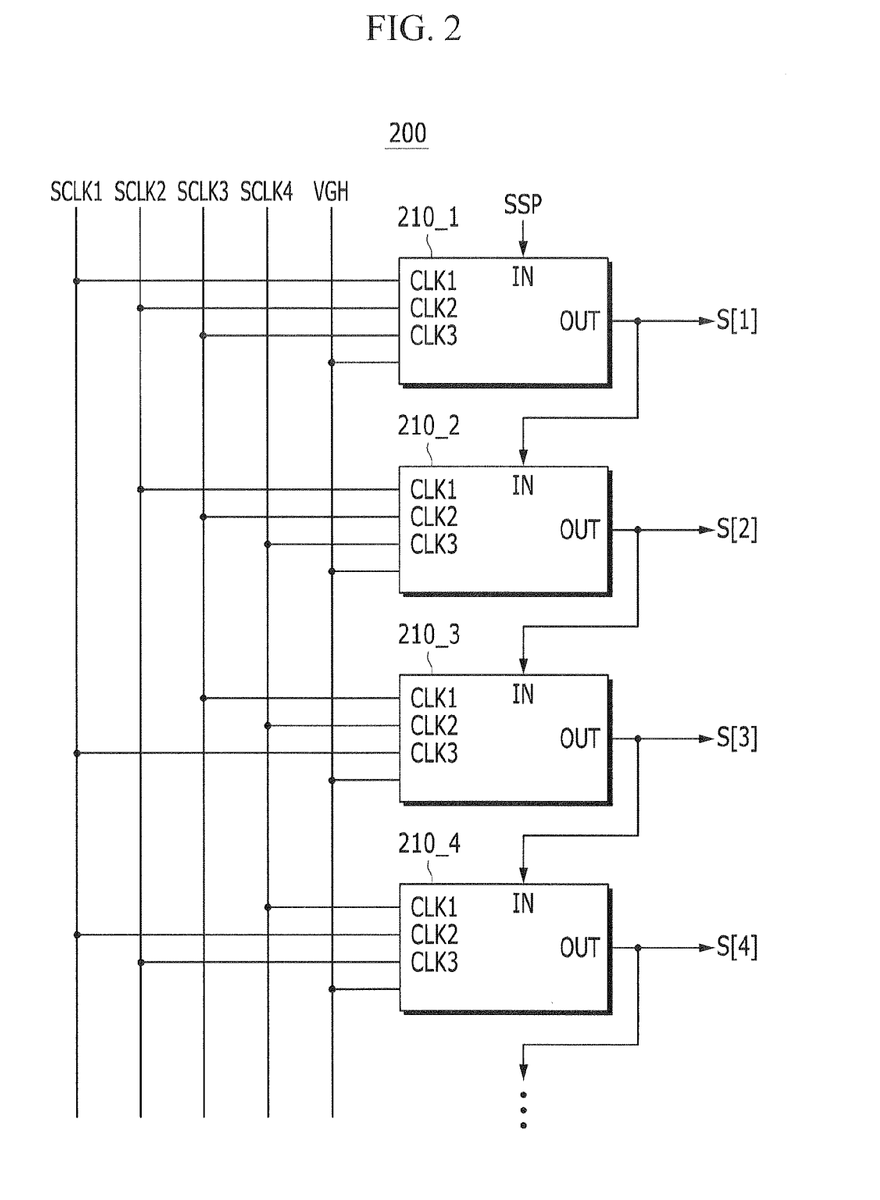
FIG. 2 is a block diagram of a scan driving device according to an embodiment of the present invention.

FIG. 2 is a block diagram of a scan driving device according to an embodiment of the present invention.

In reference to FIG. 2, the scan driving device 200 includes a plurality of scan driving blocks 210_1, 210_2, 210_3, 210_4, . . . that are sequentially arranged. The respective scan drive blocks (210_1, 210_2, 210_3, 210_4, . . . ) generate scan signals (S[1], S[2], S[3], S[4], . . . ) that are transmitted to the scan lines S1-Sn.

Each of the plurality of scan driving blocks 210_1, 210_2, 210_3, 210_4, . . . includes a first clock signal input terminal CLK1, a second clock signal input terminal CLK2, a third clock signal input terminal CLK3, an input signal input terminal IN, and an output terminal OUT.

The first clock signal input terminal CLK1, the second clock signal input terminal CLK2, and the third clock signal input terminal CLK3 of each of the plurality of scan driving blocks 210_1, 210_2, 210_3, 210_4, . . . are applied with three clock signals among a first clock signal SCLK1, a second clock signal SCLK2, a third clock signal SCLK3, and a fourth clock signal SCLK4.

The first scan driving block 210_1 is applied with the first clock signal SCLK1, the second clock signal SCLK2, and the third clock signal SCLK3. The second scan driving block 210_2 is applied with the second clock signal SCLK2, the third clock signal SCLK3, and the fourth clock signal SCLK4. The third scan driving block 210_3 is applied with the third clock signal SCLK3, the fourth clock signal SCLK4, and the first clock signal SCLK1. The fourth scan driving block 210_4 is applied with the fourth clock signal SCLK4, the first clock signal SCLK1, and the second clock signal SCLK2. With such a method, three clock signals among four clock signals SCLK1 to SCLK4 are rotationally inputted to the plurality of scan driving blocks 210_1, 210_2, 210_3, 210_4, . . . which are arranged in sequence. In this case, scan driving blocks 210_5, 210_6, 210_7, 210_8 repeat the input of the clock signals SCLK1 to SCLK4 as do scan driving blocks 210_1, 210_2, 210_3, 210_4. This input pattern is repeated for the rest of the scan driving blocks.

A power source voltage VGH is applied to each of the plurality of scan driving blocks 210_1, 210_2, 210_3, 210_4, . . . .

The scan signals of the sequentially arranged scan driving blocks are input to input signal input terminals IN of the respective scan driving blocks 210_1, 210_2, 210_3, 210_4, . . . . That is, when the plurality of scan driving blocks 210_1, 210_2, 210_3, 210_4, . . . sequentially output the scan signal, a scan signal S[k−1] of the (k−1)th scan driving block 210_(k−1) is input to an input signal input terminal IN of the k-th scan driving block 210__k. In this case, a scan start signal SSP is input to the input signal input terminal IN of the first scan driving block 210_1.

Each of the scan driving blocks 210_1, 210_2, 210_3, 210_4, . . . output scan signals S[1], S[2], S[3], S[4], . . . generated according to signals input to the first clock signal input terminal CLK1, the second clock signal input terminal CLK2, the third clock signal input terminal CLK3, and the input signal input terminal IN through an output terminal OUT.

The first scan driving block 210_1 transmits a scan signal S[1] generated by receiving the scan start signal SSP to the first scan line S1 and an input signal input terminal IN of the second scan driving block 210_2. The k-th scan driving block 210__k outputs a scan signal S[k] that is generated according to the scan signal S[k−1] output from the (k−1)th scan driving block 210_(k−1) (1<k≤n).

The scan driving device 200 sequentially outputs the scan signals by four clock signals SCLK1, SCLK2, SCLK3, and SCLK4 having different synchronizations with two duty periods that are repeated with a low level duty cycle and a high level duty cycle, and a power source voltage VGH. A driving method of the scan driving device will be described later with reference to FIG. 4.

Figure 3:
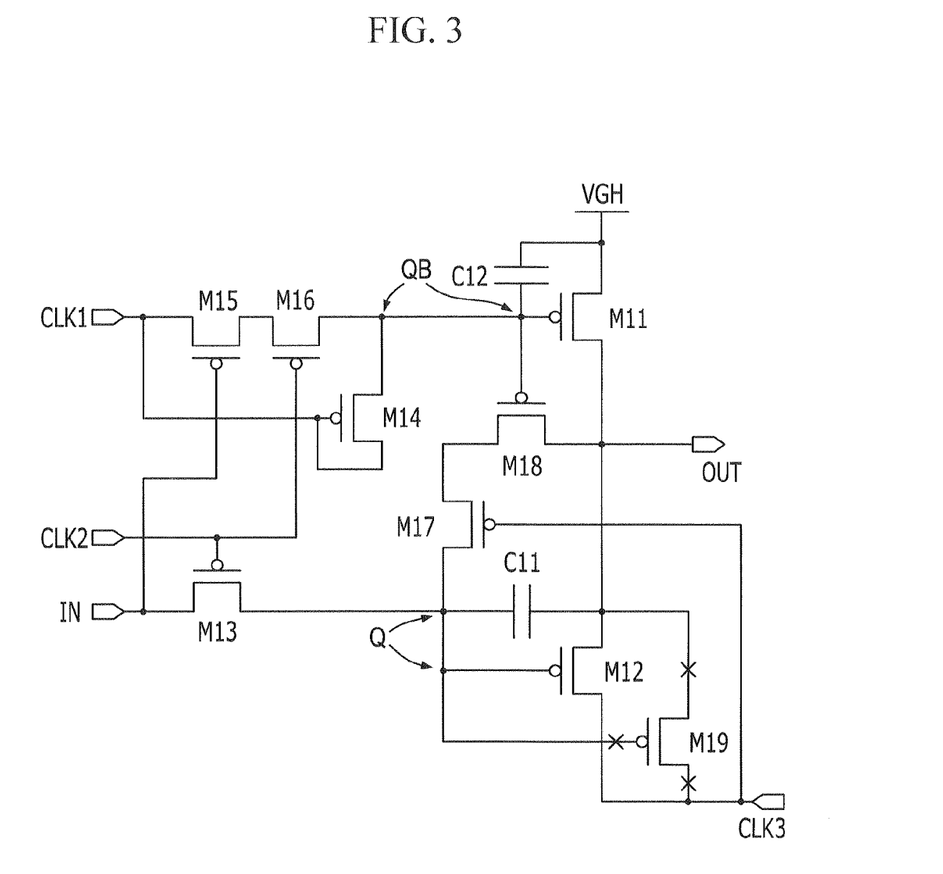
FIG. 3 is a circuit diagram of a scan driving block according to an embodiment of the present invention.

FIG. 3 is a circuit diagram of a scan driving block according to an embodiment of the present invention.

FIG. 3 illustrates the scan driving block included in the scan driving device of FIG. 2.

The scan driving block includes a plurality of transistors M11, M12, M13, M14, M15, M16, M17, M18, and M19 and a plurality of capacitors C11 and C12.

The first transistor M11 includes the gate electrode connected to the first node QB, one electrode connected to the power source voltage VGH, and the other electrode connected to the output terminal OUT.

The second transistor M12 includes the gate electrode connected to the second node Q, one electrode connected to the third clock signal input terminal CLK3, and the other electrode connected to the output terminal OUT.

The third transistor M13 includes the gate electrode connected to the second clock signal input terminal CLK2, one electrode connected to the input signal input terminal IN, and the other electrode connected to the second node Q.

The fourth transistor M14 includes the gate electrode connected to the first clock signal input terminal CLK1, one electrode connected to the first clock signal input terminal CLK1, and the other electrode connected to the first node QB.

The fifth transistor M15 includes the gate electrode connected to the input signal input terminal IN, one electrode connected to the first clock signal input terminal CLK1, and the other electrode connected to one electrode of the sixth transistor M16.

The sixth transistor M16 includes the gate electrode connected to the second clock signal input terminal CLK2, one electrode connected to the other electrode of the fifth transistor M15, and the other electrode connected to the first node QB.

The seventh transistor M17 includes the gate electrode connected to the third clock signal input terminal CLK3, one electrode connected to the second node Q, and the other electrode connected to one electrode of the eighth transistor M18.

The eighth transistor M18 includes the gate electrode connected to the first node QB, one electrode connected to the other electrode of the seventh transistor M17, and the other electrode connected to the output terminal OUT.

The ninth transistor M19 includes the gate electrode connected to the second node Q, one electrode connected to the third clock signal input terminal CLK3, and the other electrode connected to the output terminal OUT. In the producing process, the gate electrode, one electrode, and the other electrode of the ninth transistor M19 are formed with a cutoff state (X). When a defect of the second transistor M12 is generated, the ninth transistor M19 is substituted for the second transistor M12. The cutoff state means a state of disconnection.

The first capacitor C11 includes one electrode connected to the second node Q and the other electrode connected to the output terminal OUT.

The second capacitor C12 includes one electrode connected to the power source voltage VGH and the other electrode connected to the first node QB.

A plurality of transistors M11 to M19 are p-channel field effect transistors. The gate-on voltage turning on the plurality of transistors M11 to M19 is a low level voltage and a gate-off voltage turning them off is a high level voltage. The power source voltage VGH is the high level voltage.

In this case, the plurality of transistors M11 to M19 are the p-channel field effect transistors, however the plurality of transistors M11 to M19 may be an n-channel field effect transistors. The gate on voltage turning on the n-channel field effect transistor is the high level voltage and the gate off voltage turning it off is a low level voltage.

The plurality of transistors M11 to M19 may be one of an amorphous silicon thin film transistor (amorphous-Si TFT), a low temperature polysilicon (LTPS) thin film transistor, and an oxide thin film transistor (TFT). The oxide thin film transistor (TFT) may have an oxide such as an amorphous IGZO (Indium-Gallium-Zinc-Oxide), ZnO (Zinc-Oxide), TiO (Titanium Oxide) as an activation layer.

Figure 4:
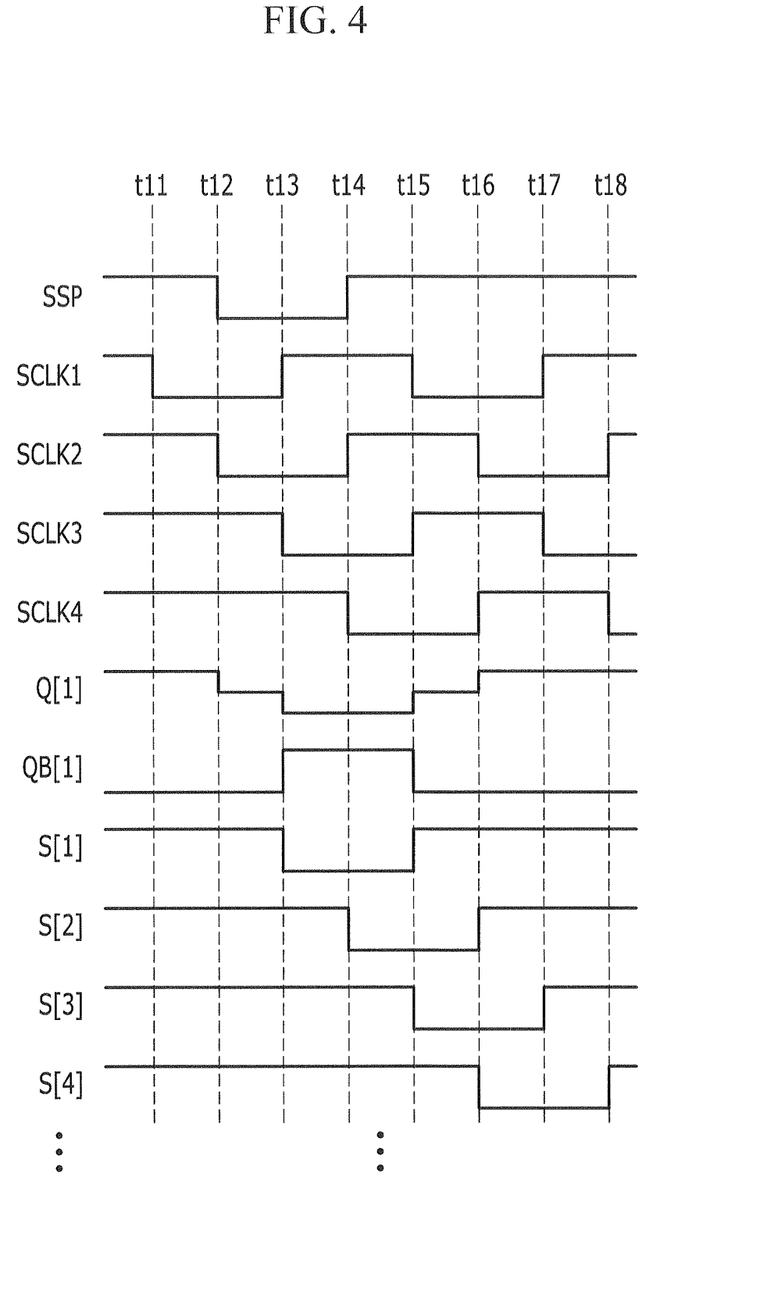
FIG. 4 is a timing diagram to explain a driving method of a scan driving device according to an embodiment of the present invention.

FIG. 4 is a timing diagram for description of a driving method of the scan driving method according to the embodiment of the present invention.

In reference to FIGS. 2 to 4, the scan driving block of FIG. 3 is included in the scan driving device 200 of FIG. 2. That is, without the defect of the second transistor M12, the scan driving device 200 is formed with the state that the gate electrode, one electrode, and the other electrode of the ninth transistor M19 are cut off (X).

The first clock signal SCLK1 has a duration of 2 duty cycles that is repeated with 1 low level duty cycle and 1 high level duty cycle. The duty cycle of the clock signal implies a period during which the transistors included in the scan driving block are turned on. The second clock signal SCLK2 is a signal generated by shifting the first clock signal SCLK1 by ½ a duty cycle. The third clock signal SCLK3 is a signal generated by shifting the second clock signal SCLK2 by ½ a duty cycle. The fourth clock signal SCLK4 is a signal generated by shifting the third clock signal SCLK3 by ½ a duty cycle. That is, the four clock signals SCLK1 to SCLK4 respectively have different synchronization.

For better understanding and ease of description, voltage levels of the first node QB[1] and the second node Q[1] of the first scan driving block 210_1 and operation of the first scan driving block 210_1 will be described. The first scan driving block 210_1 is input with the first clock signal SCLK1, the second clock signal SCLK2, and the third clock signal SCLK3 among the four clock signals SCLK1 to SCLK4.

The scan start signal SSP is applied as a low level voltage during a period t12 to t14.

During a period t11 to t12, the first clock signal SCLK1 is applied as a low level voltage and the second and third clock signals SCLK2 and SCLK3 are applied as high level voltages. Then, the fourth transistor M14 is turned on and the low level voltage is transmitted to the first node QB[1]. The first transistor M11 is turned on and the power source voltage VGH is transmitted to the output terminal OUT through the turned-on first transistor M11. That is, the scan signal S[1] of the high level voltage is output through the output terminal OUT.

In a period t12-t13, the scan start signal SSP, the first clock signal SCLK1, and the second clock signal SCLK2 are applied as the low level voltage, and the third clock signal SCLK3 is applied as the high level voltage. The third transistor M13, the fourth transistor M14, the fifth transistor M15 and the sixth transistor M16 are turned on by the signal of the low level voltage. The voltage of the low level is transmitted to the first node QB[1] and the second node Q[1]. By the low level voltage of the first node QB[1], the first transistor M11 is turned on and the power source voltage VGH is transmitted to the output terminal OUT through the turned-on first transistor M11. By the low level voltage of the second node Q[1], the second transistor M12 is turned on and a high level voltage is transmitted to the output terminal OUT through the turned-on second transistor M12. That is, the scan signal S[1] of the high level voltage is output through the output terminal OUT. In this case, the first capacitor C11 is charged with a voltage corresponding to a voltage difference between the low level voltage of the second node Q[1] and the high level voltage of the output terminal OUT.

In a period t13-t14, the scan start signal SSP, the second clock signal SCLK2, and the third clock signal SCLK3 are applied as the low level voltage, and the first clock signal SCLK1 is applied as the high level voltage. Due to the low level signal, the third transistor M13, the fifth transistor M15, the sixth transistor M16, and the seventh transistor M17 are turned on. Through the turned-on third transistor M13, the low level voltage is transmitted to the second node Q[1]. Through the turned-on fifth and sixth transistors M15 and M16, the high level voltage is transmitted to the first node QB[1]. The first transistor M11 and the eighth transistor M18 are turned off by the high level voltage of the first node QB[1]. As the third clock signal SCLK3 is changed to the low level voltage, the voltage of the second node Q[1] falls further lower than the low level voltage due to gate-drain coupling of the second transistor M12. Then, the second transistor M12 is turned on by a bootstrap effect due to the first capacitor C11. Through the turned-on second transistor M12, the third clock signal SCLK3 of the low level voltage is transmitted to the output terminal OUT. That is, the scan signal S[1] of the low level voltage is output through the output terminal OUT.

In a period t14-t15, the third clock signal SCLK3 is applied as the low level voltage, and the scan start signal SSP, the first clock signal SCLK1, and the second clock signal SCLK2 are applied as the high level voltage. By the high level signal, the third transistor M13, the fourth transistor M14, the fifth transistor M15, and the sixth transistor M16 are turned off. The first node QB[1] becomes floated and the voltage of the first node QB[1] maintains the high level voltage. The voltage of the second node Q[1] is maintained as the low level voltage by the voltage stored in the first capacitor C11, and the second transistor M12 maintains the turned-on state. The third clock signal of the low level voltage is transmitted to the output terminal OUT though the turned-on second transistor M12. That is, the scan signal S[1] of the low level voltage is continuously output through the output terminal OUT.

As described, the first scan driving block 210_1 outputs the low level scan signal S[1] during the period t13-t15. The low level scan signal S[1] of the first scan driving block 210_1 is transmitted to the input signal input terminal IN of the second scan driving block 210_2.

In a period t15-t16, the first clock signal SCLK1 is applied as the low level voltage, and the scan start signal SSP, the second clock signal SCLK2, and the third clock signal SCLK3 are applied as the high level voltage. By the first clock signal SCLK1, the fourth transistor M14 is turned on, and the first clock signal SCLK1 of the low level voltage is transmitted to the first node QB[1]. The first transistor M11 is turned on by the low level voltage of the first node QB[1]. Through the turned-on first transistor M11, the power source voltage VGH is transmitted to the output terminal OUT. That is, the scan signal S[1] of the high level voltage is output to the output terminal OUT As the third clock signal SCLK3 is changed to the logic high level, the voltage of the second node Q[1] falls further lower than the logic low level voltage and is then increased to the logic low level voltage due to gate-drain coupling of the second transistor M12.

In a period t16-t17, the first clock signal SCLK1 and the second clock signal SCLK2 are applied as the low level voltage, and the scan start signal SSP and the third clock signal SCLK3 are applied as the high level voltage. By the first clock signal SCLK1, the fourth transistor M14 is turned on, and the first clock signal SCLK1 of the low level voltage is transmitted to the first node QB[1]. The first transistor M11 is turned on by the low level voltage of the first node QB[1]. The power source voltage VGH is transmitted to the output terminal OUT through the turned-on first transistor M11. That is, the scan signal S[1] of the high level voltage is output through the output terminal OUT. By the second clock signal SCLK2, the third transistor M13 is turned on and the scan start signal SSP of the high level voltage is transmitted to the second node Q[1]. The voltage of the second node Q[1] becomes the high level voltage. The first node QB[1] is initialized into the low level voltage and the second node Q[1] is initialized into the high level voltage.

In a period t17-t18, the second clock signal SCLK2 and the third clock signal SCLK3 are applied as the low level voltage, and the scan start signal SSP and the first clock signal SCLK1 are applied as the high level voltage. By the signal of the high level voltage, the fourth transistor M14 and the fifth transistor M15 are turned off, and the first node QB[1] becomes the floating state such that the voltage of the first node QB[1] maintains the low level voltage. Accordingly, the first transistor M11 and the eighth transistor M18 maintain the turned-on state and the power source voltage VGH is continuously transmitted to the output terminal OUT. That is, the scan signal S[1] of the high level voltage is continuously output through the output terminal OUT. As the third clock signal SCLK3 is applied as the low level voltage, the voltage of the second node Q[1] may be shaken due to gate-drain coupling of the second transistor M12. However, since the seventh transistor M17 is turned on by the third clock signal SCLK3, the high level voltage of the output terminal OUT is transmitted to the second node Q[1] through the seventh transistor M17 and the eighth transistor M18, thereby preventing the voltage of the second node Q[1] from being shaken.

The input signal input terminal IN of second scan driving block 210_2 is input with the signal S[1] that is shifted by ½ a duty cycle rather than the signal SSP input to the input signal input terminal IN of the first scan driving block 210_1. Also, the clock signals SCLK2, SCLK3, and SCLK4 that are input to the second scan driving block 210_2 are clock signal that are shifted by ½ a duty cycle rather than the clock signals SCLK1, SCLK2, and SCLK3 input to the first scan driving block 210_1. Accordingly, the second scan driving block 210_2 delays the scan signal S[2] of the low level voltage by ½ a duty cycle rather than the first scan driving block 210_1 and outputs it. Likewise, the third scan driving block 210_3 delays the scan signal S[3] of the low level voltage by ½ a duty cycle rather than the second scan driving block 210_2 and outputs it. Through this method, a plurality of scan driving blocks 210_1, 210_2, 210_3, 210_4, . . . sequentially output the scan signals S[1], S[2], S[3], S[4], . . . of the low level voltage.

Figure 5:
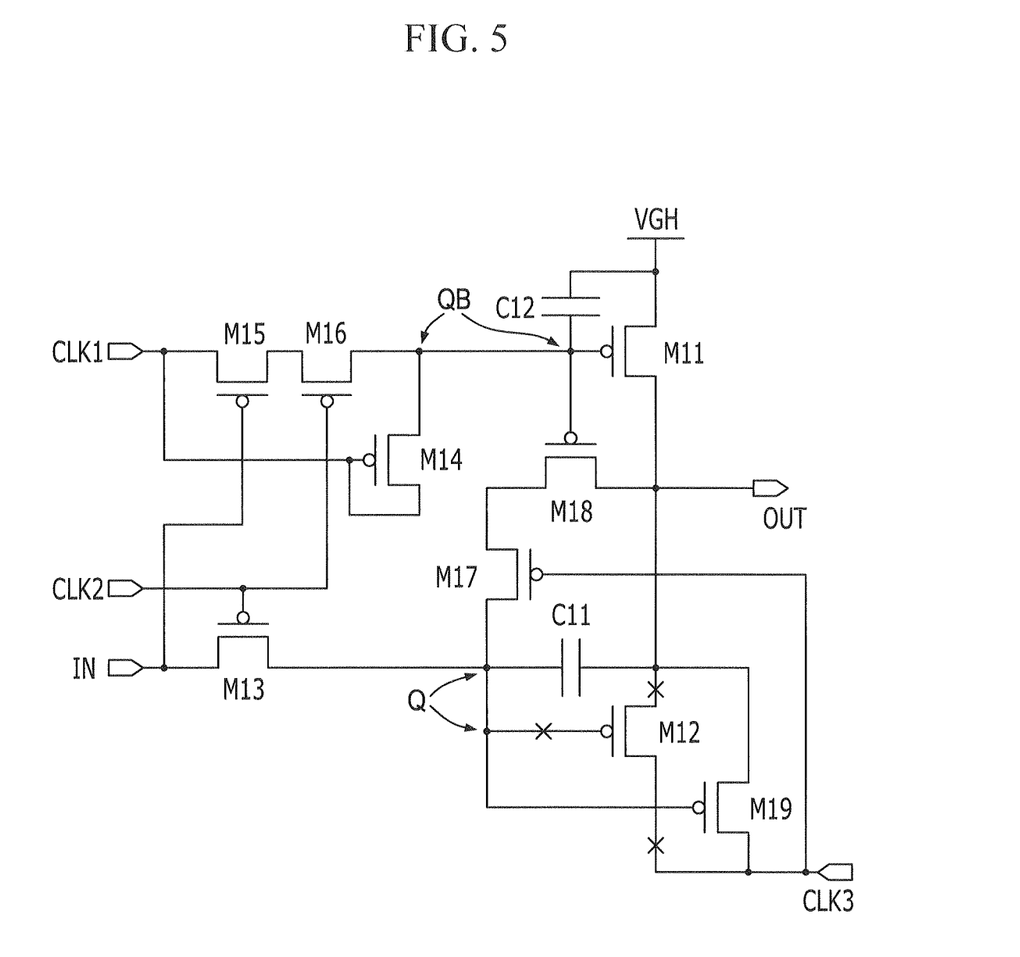
FIG. 5 is an exemplary view showing a repair method of a scan driving device according to an embodiment of the present invention.

FIG. 5 is an exemplary view showing a repair method of a scan driving device according to an embodiment of the present invention.

Referring to FIGS. 2 to 5, in the period t13-t14 of FIG. 4, when the third clock signal SCLK3 of the low level voltage is transmitted to the output terminal OUT, the second transistor M12 further decreases the voltage of the second node Q[1] more than the low level voltage by the gate-source coupling thereby maintaining the turned-on state. For this driving, the second transistor M12 is formed to occupy a relatively wide area in the scan driving block such that the gate-source coupling is sufficiently generated. As the second transistor M12 occupies a relatively wide area in the scan driving block, a defect of the second transistor M12 may be easily generated in the manufacturing process of the scan driving device 200.

In the manufacturing process, the second transistor M12 is formed for the clock signal input to the third clock signal input terminal CLK3 to be transmitted to the output terminal OUT according to the voltage of the second node Q. Also, the ninth transistor M19 is formed to be cut off (X) as shown in FIG. 3.

If the defect of the second transistor M12 is generated, the scan driving block may normally output the scan signal. Accordingly, the line defect of the display device is generated.

In the manufacturing of the scan driving device 200, the scan driving block in which the defect of the second transistor M12 is generated may be detected through the test of the scan driving device 200. If the defect of the second transistor M12 is generated, the scan driving block may be repaired as follows.

As shown in FIG. 5, the gate electrode, one electrode, and the other electrode of the defective second transistor M12 are cut off (X). Then, the gate electrode of the ninth transistor M19 is connected to the second node Q, one electrode of the ninth transistor M19 is connected to the third clock signal input terminal CLK3, and the other electrode of the ninth transistor M19 is connected to the output terminal OUT. The gate electrode, the one electrode, and the other electrode of the ninth transistor M19 may be connected by a CVD (chemical vapor deposition) wiring method. That is, the second transistor M12 is cut off and the ninth transistor M19 is connected such that the clock signal input to the third clock signal input terminal CLK3 is transmitted to the output terminal OUT according to the voltage of the second node Q.

If the second transistor M12 is cut off (X) and the ninth transistor M19 is connected, the ninth transistor M19 is operated equally to the second transistor M12, and the defective scan driving block is normally operated.

That is, the second transistor M12 is cut off (X) and the scan driving device including the scan driving block connected to the ninth transistor M19 is driven according to the timing diagram described in FIG. 4.

As described above, the ninth transistor M19 is a dummy transistor substituting for the second transistor M12 instead of maintaining the defect of the second transistor M12. Conventionally, when one second transistor M12 among a plurality of scan driving blocks is defective, the entire scan driving device is destroyed; in the present invention, however, the scan driving device 200 substitutes the ninth transistor M19 for the defective second transistor M12 such that the yield in the manufacturing process may be improved.

The drawings referred to hereinabove and the detailed description of the disclosed invention are presented for illustrative purposes only, and are not intended to define meanings or limit the scope of the present invention as set forth in the following claims. Those skilled in the art will understand that various modifications and equivalent embodiments of the present invention are possible. Consequently, the true technical protective scope of the present invention must be determined based on the technical spirit of the appended claims.

What is claimed is:

1. A scan driving device, comprising:
a plurality of scan driving blocks that are sequentially arranged,
with the plurality of scan driving blocks respectively comprising:
a first node transmitted with a clock signal input to a first clock signal input terminal;
a second node transmitted with an input signal according to a clock signal input to a second clock signal input terminal;
a first transistor transmitting a power source voltage to an output terminal according to a voltage of the first node;
a second transistor formed to transmit a clock signal input to a third clock signal input terminal to the output terminal according to a voltage of the second node; and
a dummy transistor formed to transmit the clock signal input to the third clock signal input terminal to the output terminal according to the voltage of the second node,
with one of the second transistor and the dummy transistor being cut off.

2. The scan driving device of claim 1, wherein
in a manufacturing process, the dummy transistor is formed to be cut off, and the second transistor is connected to transmit the clock signal input to the third clock signal input terminal to the output terminal according to the voltage of the second node.

3. The scan driving device of claim 2, wherein
when a defect of the second transistor is generated, the second transistor is cut off, and the dummy transistor is connected to transmit the clock signal input to the third clock signal input terminal to the output terminal according to the voltage of the second node.

4. The scan driving device of claim 1, wherein
the plurality of scan driving blocks respectively further include a first capacitor including one electrode connected to the second node and the other electrode connected to the output terminal.

5. The scan driving device of claim 4, wherein
the plurality of scan driving blocks further respectively include a second capacitor including one electrode connected to the power source voltage and the other electrode connected to the first node.

6. The scan driving device of claim 5, wherein
the plurality of scan driving blocks further respectively include a third transistor including a gate electrode connected to the second clock signal input terminal, one electrode applied with the input signal, and the other electrode connected to the second node.

7. The scan driving device of claim 6, wherein
the plurality of scan driving blocks further respectively include a fourth transistor including a gate electrode connected to the first clock signal input terminal, one electrode connected to the first clock signal input terminal, and the other electrode connected to the first node.

8. The scan driving device of claim 7, wherein
the plurality of scan driving blocks further respectively include a fifth transistor including a gate electrode applied with the input signal and one electrode connected to the first clock signal input terminal, and
a sixth transistor including a gate electrode connected to the second clock signal input terminal, one electrode connected to the other electrode of the fifth transistor, and the other electrode connected to the first node.

9. The scan driving device of claim 8, wherein
the plurality of scan driving blocks further respectively include
a seventh transistor including a gate electrode connected to the third clock signal input terminal and one electrode connected to the second node, and
an eighth transistor including a gate electrode connected to the first node, one electrode connected to the other electrode of the seventh transistor, and the other electrode connected to the output terminal.

10. The scan driving device of claim 9, wherein
at least one of the first transistor, the second transistor, the third transistor, the fourth transistor, the fifth transistor, the sixth transistor, the seventh transistor, the eighth transistor, and the dummy transistor is an oxide thin film transistor.

11. A method of repairing a scan driving device including a plurality of scan driving blocks including a first node transmitted with a clock signal input to a first clock signal input terminal, a second node transmitted with an input signal according to a clock signal input to a second clock signal input terminal, and a first transistor transmitting a power source voltage to an output terminal according to a voltage of the first node, the method comprising steps of:
forming a second transistor to transmit the clock signal input to a third clock signal input terminal to the output terminal according to a voltage of the second node;
forming a cutoff of a dummy transistor transmitting the clock signal input to the third clock signal input terminal to the output terminal according to the voltage of the second node; and
when a defect of the second transistor is generated, cutting off the second transistor and connecting the dummy transistor to transmit the clock signal input to the third clock signal input terminal according to the voltage of the second node.

* * * * *